US012760713B2

(12) United States Patent
Gonzalez et al.

(10) Patent No.: US 12,760,713 B2
(45) Date of Patent: Oct. 13, 2026

(54) YAW CONTROL FAULT DETECTION SYSTEM

(71) Applicant: Inventus Holdings, LLC, Juno Beach, FL (US)

(72) Inventors: Cesar A. Gonzalez, Port Sain Lucie, FL (US); Drake J. Viscome, Jupiter, FL (US); Robert C. Johnson, Palm City, FL (US); James W. Parker, Port Saint Lucie, FL (US); Taylor A. Reeves, Jupiter, FL (US)

(73) Assignee: Inventus Holdings, LLC, Juno Beach, FL (US)

( * ) Notice: Subject to any disclaimer, the term of this patent is extended or adjusted under 35 U.S.C. 154(b) by 223 days.

(21) Appl. No.: 18/625,816

(22) Filed: Apr. 3, 2024

(65) Prior Publication Data

US 2025/0314241 A1 Oct. 9, 2025

(51) Int. Cl.

| | |
|---|---|
| ***G01R 31/24*** | (2020.01) |
| ***F03D 17/00*** | (2016.01) |
| ***G01R 31/34*** | (2020.01) |

(52) U.S. Cl.

CPC ......... *F03D 17/029* (2023.08); *F03D 17/014* (2023.08); *G01R 31/343* (2013.01); *F05B 2260/80* (2013.01)

(58) Field of Classification Search

CPC ... G01R 31/343; F03D 17/029; F03D 17/014; F03D 7/042; F03D 7/0204; F05B 2260/80; F05B 2270/329; Y02E 10/72

See application file for complete search history.

(56) References Cited

U.S. PATENT DOCUMENTS

| | | | |
|---|---|---|---|
| 8,230,266 | B2 | 7/2012 | Hamby et al. |
| 9,140,239 | B2 | 9/2015 | Dalsgaard |
| 10,612,520 | B2 | 4/2020 | Rosenvard et al. |

(Continued)

FOREIGN PATENT DOCUMENTS

| | | | | |
|---|---|---|---|---|
| CN | 113048013 A | | 6/2021 | |
| JP | 2020076332 | * | 5/2020 | ............... F03D 1/06 |
| JP | 2020076332 A | | 5/2020 | |

OTHER PUBLICATIONS

WOISR: Notification of Transmittal of the International Search Report and the Written Opinion of the International Searching Authority, or the Declaration mailed 2025-06-04 for corresponding PCT/US2025/018713.

*Primary Examiner* — Alesa Allgood
(74) *Attorney, Agent, or Firm* — Fish & Richardson P.C.

(57) ABSTRACT

One example includes a wind turbine yaw control fault detection system. The system includes current monitors that are each configured to monitor a current amplitude of a respective one of a plurality of yaw motors of a wind turbine and to generate a current signal that is indicative of the respective current amplitude. The system further includes a processor to compare the current amplitude of each of the yaw motors relative to each other and relative to at least one threshold based on the current signal from each of the current monitors. The fault detection algorithm further determines a fault condition associated with at least one yaw mechanical drive component of the wind turbine based on the comparison of the current amplitude of each of the yaw motors relative to each other and relative to at least one threshold.

20 Claims, 7 Drawing Sheets

(56) References Cited

U.S. PATENT DOCUMENTS

| | | | |
|---|---|---|---|
| 10,662,923 B2 | 5/2020 | Dharmadhikari et al. | |
| 2013/0115043 A1 | 5/2013 | Rosenvard et al. | |
| 2023/0304478 A1 * | 9/2023 | Balzer ..................... | F03D 17/00 |

* cited by examiner

YAW CONTROL FAULT DETECTION SYSTEM

TECHNICAL FIELD

This disclosure relates generally to wind power systems, and more specifically to a yaw control fault detection system.

BACKGROUND

Renewable and natural energy sources are becoming more popular for generating power. Such renewable and natural energy sources are persistently available, require no fuel, generate no pollutants, and are more widely accepted in a more ecologically conscientious society. Such renewable and natural energy sources can be scaled to a great extent to provide renewable power plants. One such renewable energy source is a wind farm that includes wind turbines that convert the kinetic energy of the wind into electrical power. Wind turbines are manufactured in a wide range of vertical and horizontal axis types. Wind farms are becoming an increasingly large source of clean renewable energy and are used by many countries as part of a strategy to reduce reliance on fossil fuels while reducing pollution and enhancing the environment of our society.

To maximize power output from the wind, wind turbines can include yaw controls that steer the nacelle of the wind turbine to face directly into the wind. Such yaw controls can include yaw motors and associated mechanical components. As with any mechanical components, wear and degradation of the motors and/or the mechanical parts can result in fault conditions that yield suboptimal operation or failure of the yaw control system. The yaw control components can be maintained or replaced by technicians. However, the time and effort of servicing a faulted component is significant given the large size of the wind turbines, the weight of the components, and the safety measures that enable a technician to perform the effort of maintaining or replacing the yaw control components in a safe and effective manner.

SUMMARY

One example includes a wind turbine yaw control fault detection system. The system includes current monitors that are each configured to monitor a current amplitude of a respective one of a plurality of yaw motors of a wind turbine and to generate a current signal that is indicative of the respective current amplitude. The system further includes a processor to compare the current amplitude of each of the yaw motors relative to each other and relative to at least one threshold based on the current signal from each of the current monitors. The fault detection algorithm further determines a fault condition associated with at least one yaw mechanical drive component of the wind turbine based on the comparison of the current amplitude of each of the yaw motors relative to each other and relative to at least one threshold.

Another example includes a method for determining a fault condition associated with a wind turbine. The method includes monitoring a current amplitude of a respective one of a plurality of yaw motors of the wind turbine and generating a plurality of current signals that are each indicative of the current amplitude of one of the respective yaw motors. The method also includes comparing the current amplitude of each of the yaw motors relative to each other and relative to at least one threshold based on the current signals. The method also includes determining a fault condition associated with at least one yaw mechanical drive component of the wind turbine based on the comparison of the current amplitude of each of the yaw motors relative to each other and relative to at least one threshold. The method further includes indicating the fault condition to a user via a user interface.

Another example includes a yaw motor control system associated with a wind turbine. The system includes a plurality of yaw motors, a plurality of yaw mechanical drive components and a logic controller configured to control operation of the wind turbine. The system further includes a wind turbine yaw control fault detection system. The wind turbine yaw control fault detection system includes a plurality of current monitors that are each configured to monitor a current amplitude of a respective one of the yaw motors and to generate a current signal that is indicative of the respective current amplitude. The wind turbine yaw control fault detection system also includes a processor configured to receive the current signal from each of the current monitors and to implement a fault detection algorithm. The fault detection algorithm is configured to compare the current amplitude of each of the yaw motors relative to each other and relative to at least one threshold based on the current signal from each of the current monitors. The fault detection algorithm is further configured to determine a fault condition associated with at least one of the yaw mechanical drive components of the wind turbine based on the comparison of the current amplitude of each of the yaw motors relative to each other and relative to at least one threshold.

DETAILED DESCRIPTION

Figure 1:
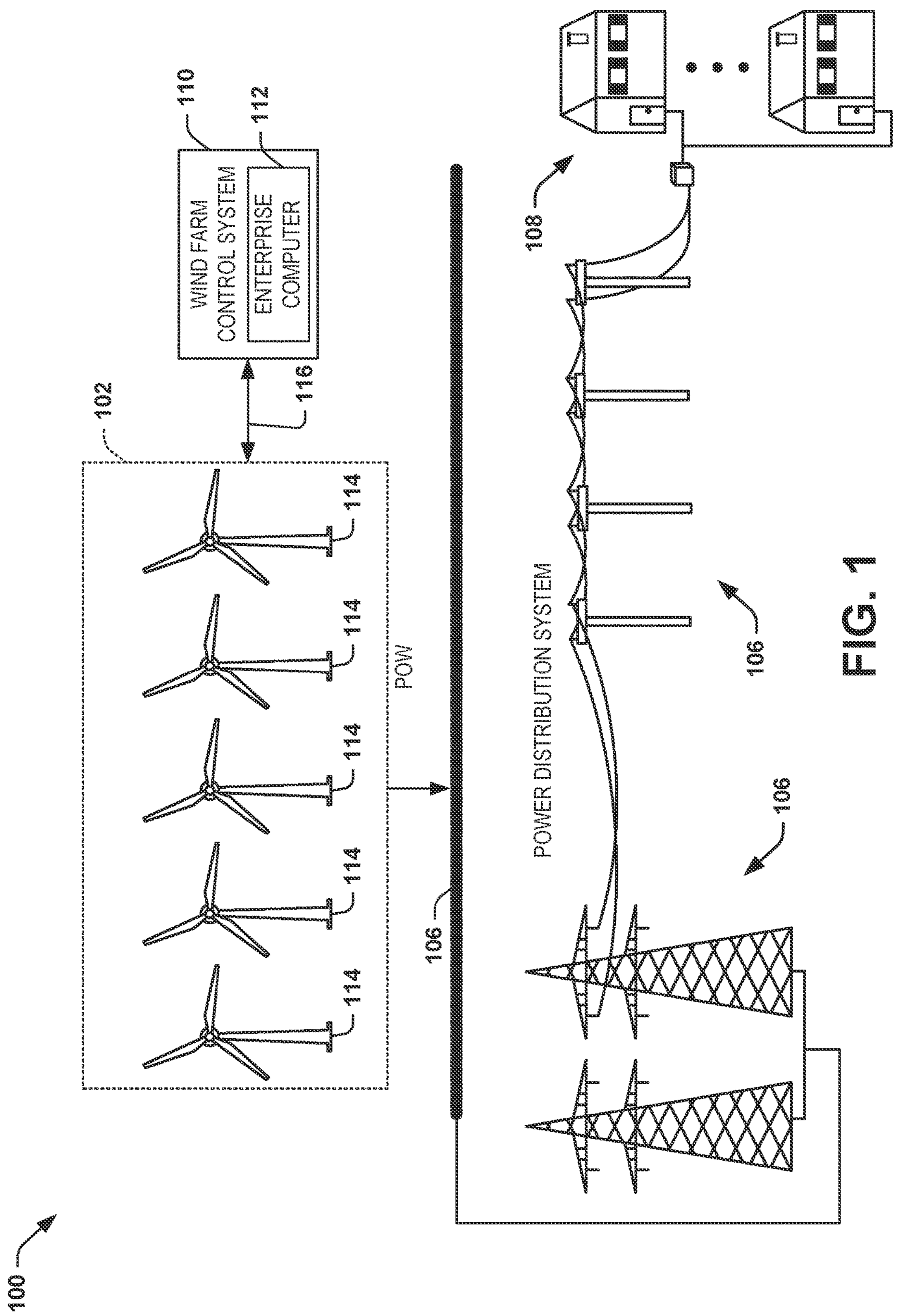
FIG. 1 illustrates an example of a utility power system.

This disclosure relates generally to wind power systems, and more specifically to a yaw control fault detection system. The yaw control fault detection system can be implemented at least partially in a wind turbine that is a part of a wind farm. The yaw control system of a wind turbine has a significant number of mechanical components that can all be subject to deterioration and eventual failure. Such deterioration and/or failure can thus result in an inability or decreased capability of providing yaw control of a nacelle of the wind turbine to face the direction of wind, thereby decreasing efficiency of operation of the wind turbine. Therefore, routine maintenance of the mechanical parts, as well as replacement of failed mechanical parts, is important to maintain efficiency of the wind turbines to provide for optimization of providing power to the power grid.

However, given the large quantity of mechanical components and the complexity of the yaw control system, it can be difficult to identify a specific component that caused a fault condition when the yaw control system of the wind turbine fails to operate normally. Maintaining and replacing parts on a wind turbine is a particularly onerous task, as it requires significant time and effort for a technician to climb to the top of the wind turbine, particularly given the extensive amount of safety measures that are necessary to avoid a dangerous fall. The time and effort of maintaining and replacing parts is amplified by not knowing the source of the fault, thus requiring a technician to climb to the top of the wind turbine to diagnose the fault condition before being able to obtain the proper equipment to replace and/or repair. As such, it is difficult to provide maintenance and/or replacement of parts of a faulted yaw control system.

As described herein, the yaw control fault detection system can be configured to determine the presence of a fault condition, as well as being able to identify a specific cause of the fault condition. The yaw control fault detection system includes a plurality of current monitors that are configured to monitor the amplitude of the current of each of the respective yaw motors of the yaw control system. The current monitors can thus generate current signals (e.g., digital signals) that are indicative of the amplitude of the currents of the respective yaw motors. The current signals can be provided to a processor that is configured to implement a fault detection algorithm to determine the fault condition. As an example, the processor can be included in a logic controller that is specific to yaw control system of the respective wind turbine, such that the fault information can be provided to an enterprise computer system that controls the respective wind farm via communication signals. As another example, the processor can be included in the enterprise compute system, such that the current signals are provided to the enterprise computer system via the communication signals. In either example, the processor can be configured to implement a fault detection algorithm to provide information regarding the presence of and source of a fault condition to a user.

As an example, the fault detection algorithm can be configured to compare the current signals with each other and with at least one predefined threshold. The at least one predefined threshold can include at least one time-dependent threshold, as well, such that the changes in the current amplitudes of the yaw motors can be evaluated over a time duration. The fault detection algorithm can thus compare the current amplitudes with each other to determine anomalies in the amplitudes. For example, for nominal operation of the yaw control system in response to activation of the yaw motors, the current amplitude of a given one of the yaw motors should be approximately the same as the current amplitudes of the other yaw motors. Therefore, the fault detection algorithm can determine if one of the current amplitudes varies from the other current amplitudes by a difference threshold based on comparing the current amplitudes with each other.

The difference threshold can thus be determinative of a fault condition associated with any of the yaw mechanical drive components and/or the yaw motors. As described herein, the terms "yaw mechanical drive components" and "yaw motors" are provided separately, but the term "yaw mechanical drive components" is intended to also include the yaw motors, as well as other mechanical components. The amplitude of the current difference, the time duration of the current difference, and/or a variety of other differences between the current amplitudes of the yaw motors can be indicative of different fault conditions. Additionally, the current amplitude of a given one yaw motor can be compared with the current amplitude of the same yaw motor at different times along the activation of the respective yaw motor, such that a deviation from a static threshold and/or a difference between minimum and maximum amplitudes can be indicative of a fault condition of the respective yaw motor and/or the yaw mechanical drive components. As a result, by identifying the specific source of the fault condition, and thus the specific yaw mechanical drive component and/or yaw motor that caused the fault condition, technicians do not need to ascend to the top of the wind turbine to diagnose the source of the fault condition first. Instead, the technician can prepare for the maintenance or replacement steps by supplying the proper equipment based on the known fault condition before ascending to the top of the wind turbine to replace or maintain the specific yaw mechanical drive component.

The detection of fault conditions as described above refers to detecting real-time fault conditions resulting in failure or atypical operation of the respective yaw mechanical drive component. However, in addition to detecting real-time fault conditions, the yaw control fault detection system can also be implemented to identify predictive fault conditions. As described herein, the term "predictive fault condition" refers to identifying a yaw mechanical drive component that operates with acceptable capability to perform a respective function at a present time, but is identified by the comparison of the current amplitudes as having characteristics that indicate an imminent failure that can result in an imminent fault condition. Therefore, the yaw control fault detection system can also be effective to identify such predictive fault conditions to optimize routine maintenance schedules of wind turbines in a wind farm. For example, in response to determining a predictive fault condition, maintenance parts inventory and technician scheduling can be obtained prior to actual failure, thereby mitigating operational downtime of wind turbines and providing greater efficiency in maintaining the wind farm.

A wind farm power system that can include one or more iterations of the yaw control fault detection system is demonstrated in the example of FIG. 1. FIG. 1 illustrates an example of a utility power system 100. The utility power system 100 includes a power generator system 102 that is configured to provide power, demonstrated in the example of FIG. 1 as POW, to a power transmission system 104. The power transmission system 104 can correspond to a power bus or one or more points-of-interconnect (POIs) that provide power via a power distribution system 106 (e.g., transformers, substations, and power lines) to consumers, demonstrated generally at 108. In the example of FIG. 1, the power generator system 102 is demonstrated as being controlled by a wind farm control system 110. The wind farm control system 110 can include an enterprise computer system 112, such as a Supervisory Control and Data Acquisition (SCADA) computer, which allows user at a local or remote location to monitor and control the operation of the power generator system. While the power generator system 102 is demonstrated in the example of FIG. 1 as a wind farm, the power generator system 102 could also include additional power generating equipment (e.g., solar panels, geothermal power generators, hydroelectric power generators, fossil fuel power plants, etc.).

In the example of FIG. 1, the power generator system 102 includes a plurality of wind turbines 114 that are configured to generate at least a portion of the power POW. As an example, each of the wind turbines 114 can include a yaw control system that is configured to provide yaw control of the respective wind turbine 114 to maximize efficiency of wind capture. As an example, the enterprise computer system 112 can communicate with logic controllers associated with each of the wind turbines 114 to monitor performance of and provide control of the individual wind turbines 114 via communication lines, demonstrated generally at 116. Additionally, each of the yaw control systems can include a yaw control fault detection system that is configured to detect the presence of a fault condition, as well as to identify the cause of the fault condition (e.g., a specific one or more components that are atypically operating or have failed). The yaw control fault detection system can provide the fault information to the enterprise computer system 112 via the communication lines 116, thereby providing specific identification of the specific wind turbine 114 that exhibits the fault condition, as well as the specific one or more yaw mechanical drive components of the yaw control system that is faulted. Therefore, users at the wind farm control system 110 can schedule maintenance and/or replacement of the failed or faulted component(s) in a timely and efficient manner.

Figure 2:
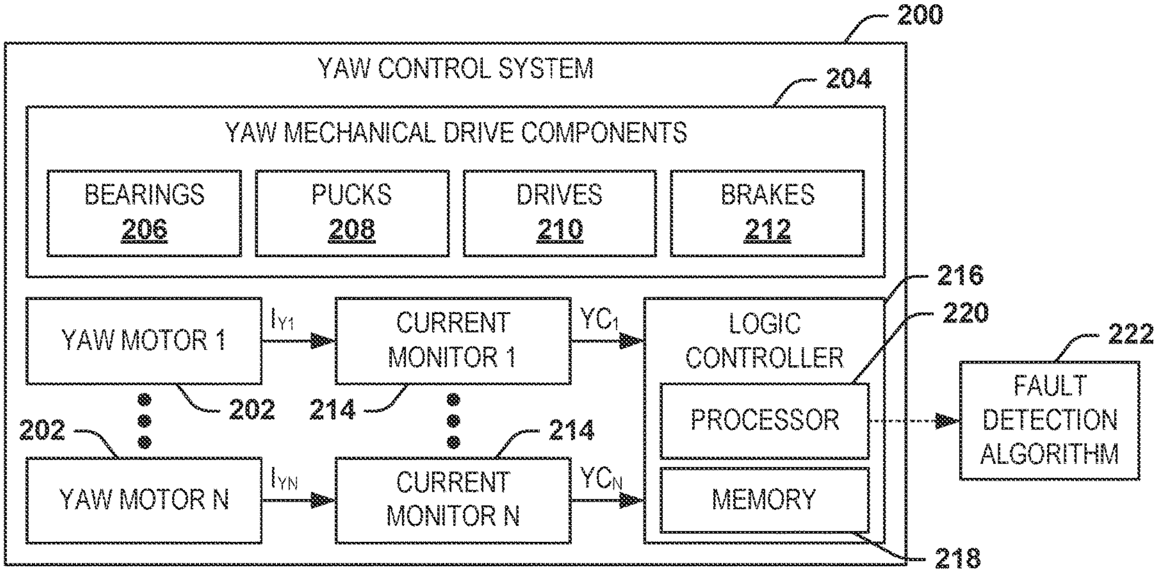
FIG. 2 illustrates an example block diagram of a yaw control system.

FIG. 2 illustrates an example block diagram of a yaw control system 200. The yaw control system 200 can be implemented on a wind turbine, such as one of the wind turbines 114 in the example of FIG. 1. The yaw control system 200 includes a plurality N of yaw motors 202, where N is an integer greater than one, that collectively provide yaw motion of the nacelle of the respective wind turbine. As an example, each of the yaw motors 202 can be configured as three-phase AC motors. The yaw motors 202 can be configured to engage with a set of yaw mechanical drive components 204 to provide yaw motion of the nacelle of the associated wind turbine. In the example of FIG. 2, the yaw mechanical drive components 204 can include the yaw motors 202, as well as any or all of motor bearings 206, pucks 208, yaw drives 210, and brakes 212 (e.g., corresponding to operation with the respective yaw motors 202). The yaw mechanical drive components 204 demonstrated in the example of FIG. 2 is not intended to be an exhaustive list of mechanical drive components associated with yaw control or faults associated with yaw control. Therefore, other parts or components associated with yaw control (e.g., electrical interlock contactor(s) and/or breaker(s)) can be included in the yaw mechanical drive components 204.

The yaw control fault detection system associated with the yaw control system 200 can include a plurality N of current monitors 214 that are each coupled to a respective one of the yaw motors 202. The current monitors 214 can thus monitor an amplitude of the currents of the yaw motors 202, demonstrated as currents $I_{Y1}$ through $I_{YN}$, during operation of the yaw motors 202 (e.g., during a yaw motion action). Each of the current monitors 214 is configured to provide a current signal, demonstrated as signals $YC_1$ through $YC_N$, to a logic controller 216. As an example, the signals $YC_1$ through $YC_N$ can be digital signals having a digital value that corresponds to the amplitude of the respective currents $I_{Y1}$ through $I_{YN}$.

Figure 3:
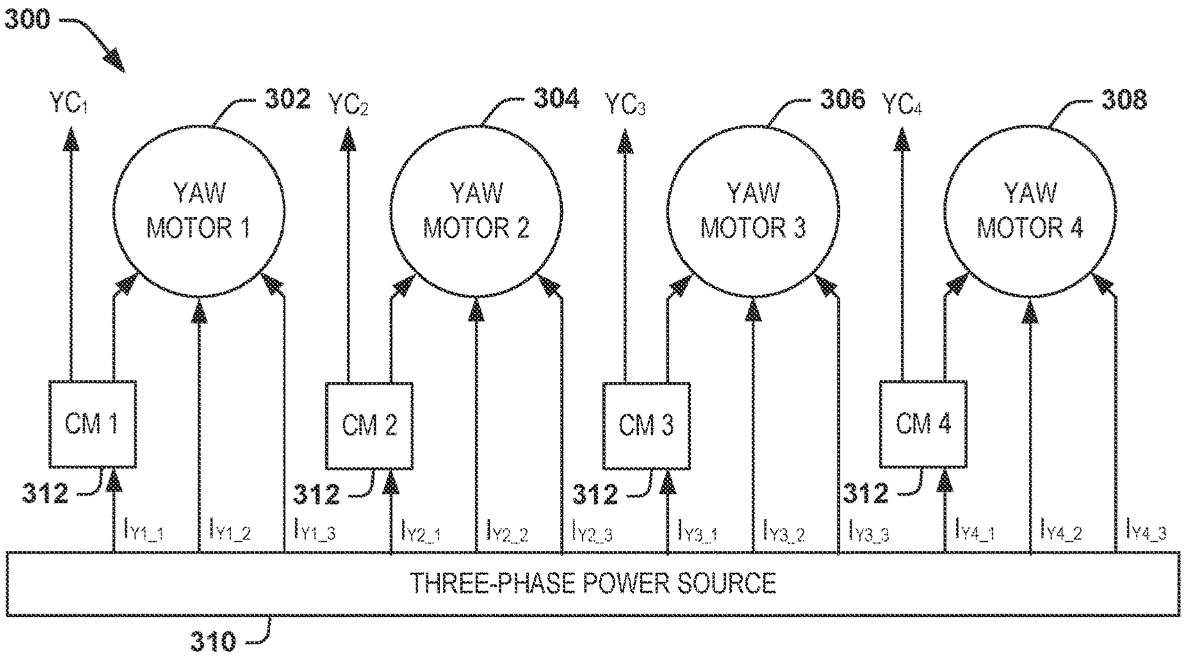
FIG. 3 illustrates an example diagram of yaw motors.

FIG. 3 illustrates an example diagram 300 of yaw motors. The yaw motors are demonstrated in the diagram 300 as a first yaw motor 302, a second yaw motor 304, a third yaw motor 306, and a fourth yaw motor 308. The yaw motors 302, 304, 306, and 308 can correspond to the N yaw motors 202 in the example of FIG. 2, such that N is a quantity of four. The quantity of four yaw motors 302, 304, 306, and 308 is provided as one example. However, as described above, the quantity of N can be any integer greater than one.

In the example of FIG. 3, each of the yaw motors 302, 304, 306, and 308 is demonstrated as a three-phase AC motor that provides rotational motion in response to respective three-phase currents $I_{Y1}$, $I_{Y2}$, $I_{Y3}$, and $I_{Y4}$ provided from a three-phase power source 310. Each of the three-phase currents $I_{Y1}$, $I_{Y2}$, $I_{Y3}$, and $I_{Y4}$ is demonstrated in the diagram as including three separate phase components $I_{YX\_1}$, $I_{YX\_2}$, and $I_{YX\_3}$ that are each 120° out-of-phase of each other, where X is an index corresponding to the respective one of the yaw motors 302, 304, 306, and 308. The yaw motors 302, 304, 306, and 308 can thus be arranged about and/or in engagement with the yaw mechanical drive components 204 of the yaw control system 200. Accordingly, in response to the three-phase currents $I_{Y1}$, $I_{Y2}$, $I_{Y3}$, and $I_{Y4}$, the yaw motors 302, 304, 306, and 308 can cooperate to provide yaw motion of the nacelle of the wind turbine.

In the example of FIG. 3, the diagram 300 includes a set of current monitors 312 labeled "CM 1" through "CM 4" that are each provided on one component of the three-phase currents, demonstrated as the $I_{YX\_1}$ component. The current monitors 312 can thus monitor an amplitude of the $I_{YX\_1}$ component of the three-phase currents $I_{Y1}$, $I_{Y2}$, $I_{Y3}$, and $I_{Y4}$ to generate respective current signals $YC_1$, $YC_2$, $YC_3$, and $YC_4$ corresponding to the amplitudes of the three-phase currents $I_{Y1}$, $I_{Y2}$, $I_{Y3}$, and $I_{Y4}$. The current signals $YC_1$, $YC_2$, $YC_3$, and $YC_4$ are thus provided to the logic controller 216.

Referring back to the example of FIG. 2, the logic controller 216 can be configured to control the functional operations of the wind turbine, including the yaw motion control. For example, the logic controller can be any of a variety of programmable logic controllers (PLCs). In the example of FIG. 2, the logic controller 216 includes a memory 218 and a processor 220. The processor 220 can be included as part of the yaw control fault detection system, and can also provide additional processing capabilities for the logic controller 216 (e.g., to implement operational control of the wind turbine). In the example of FIG. 2, the processor 220 can be configured to engage with or implement a fault detection algorithm 222.

As described herein, the fault detection algorithm 222 can be configured to determine a fault condition associated with at least one of the yaw mechanical drive components 204 based on the current signals $YC_1$ through $YC_N$. As an example, the fault detection algorithm 222 can be configured to compare the current signals $YC_1$ through $YC_N$ with each other and with at least one predefined threshold. As an example, the predefined threshold(s) can include at least one time-dependent threshold. Therefore, the changes in the amplitudes of the currents $I_{Y1}$ through $I_{YN}$ of the yaw motors 202 can be evaluated over a time duration. The fault detection algorithm 222 can thus compare the amplitudes of the currents $I_{Y1}$ through $I_{YN}$ with each other to determine one or more anomalies in the amplitudes. For example, for nominal operation of the yaw control system 200 in response to activation of the yaw motors 202, the amplitudes of the currents $I_{Y1}$ through $I_{YN}$ of the yaw motors 202 should be approximately the same. Therefore, the fault detection algorithm 222 can determine if the difference between one of the amplitudes of the currents $I_{Y1}$ through $I_{YN}$ and any of the other amplitudes exceeds a difference threshold based on comparing the amplitudes of the currents $I_{Y1}$ through $I_{YN}$ with each other.

Figure 4:
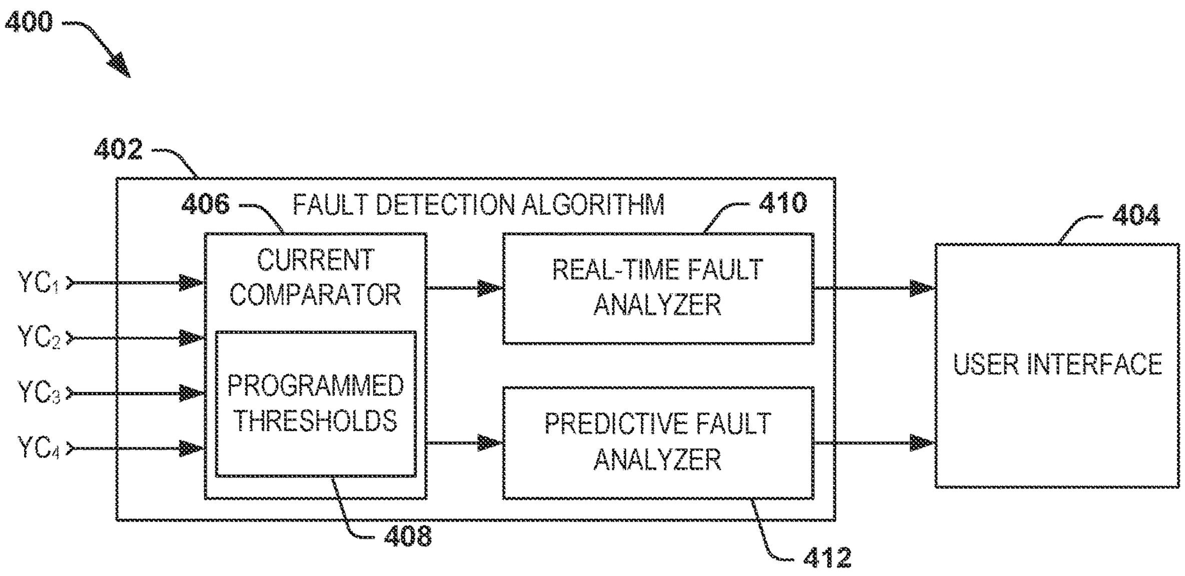
FIG. 4 illustrates an example block diagram of fault detection.

FIG. 4 illustrates an example block diagram 400 of fault detection. The block diagram 400 includes a fault detection algorithm 402 and a user interface 404. The fault detection algorithm 402 can correspond to the fault detection algorithm 222 in the example of FIG. 2. Therefore, reference is to be made to the example of FIG. 2 in the following description of the example of FIG. 4.

The fault detection algorithm 402 includes a current comparator 406 that is configured to evaluate the received current signals $YC_1$ through $YC_4$ (in the example of four yaw motors, as demonstrated in the example of FIG. 3). The fault detection algorithm 402 can compare the amplitudes of the currents $I_{Y1}$ through $I_{Y4}$, as indicated in the current signals $YC_1$ through $YC_4$, with each other and with at least one threshold. In the example of FIG. 4, the fault detection algorithm 402 is configured to access programmed thresholds 408 that can correspond to known current amplitude behaviors of the currents $I_{Y1}$ through $I_{Y4}$ that can be indicative of specific fault conditions. As an example, the programmed thresholds 408 can be stored in the memory 218, having been input to the logic controller 216. The current comparator 406 can thus determine differences between the amplitudes of the currents $I_{Y1}$ through $I_{Y4}$ with respect to each other and with respect to the programmed thresholds 408.

The fault detection algorithm 402 includes a real-time fault analyzer 410 and a predictive fault analyzer 412. The analyzers 410 and 412, as well as the current comparator 406, can be implemented as programs (e.g., subroutines, program files, and/or extensions) that are part of the fault detection algorithm 402, which can be implemented on one or more processors and/or application specific integrated circuits (ASICs). The analyzers 410 and 412 can be configured to analyze the differences between the amplitudes of the currents $I_{Y1}$ through $I_{Y4}$ with respect to each other and with respect to the programmed thresholds 408 to determine the presence of a fault condition and/or a predictive or imminent fault condition. As described herein, the real-time fault analysis algorithm 410 and the predictive fault analysis algorithm 412 can be implemented as the same algorithm that can provide different results based on the analysis, and are demonstrated in the example of FIG. 4 as bifurcated for ease in description. For example, the analyzers 410 and 412 can be configured to analyze the currents $I_{Y1}$ through $I_{Y4}$ in the same manner, but can apply different thresholds of the programmed thresholds 408 of varying magnitude to determine if a given fault condition is happening in currently in real-time, or will happen in an imminent future time. Therefore, the following description of fault conditions can apply to both real-time fault conditions and predictive fault conditions, as determined by the real-time fault analysis algorithm 410 and the predictive fault analysis algorithm 412, respectively.

The analyzers 410 and 412 can be configured to apply any of a variety of statistical analyses to the amplitudes and/or differences between the currents $I_{Y1}$ through $I_{Y4}$ and the programmed thresholds 408. For example, the analyzers 410 and 412 can determine if an amplitude of one of the currents $I_{Y1}$ through $I_{Y4}$ is different than the other currents $I_{Y1}$ through $I_{Y4}$ by a threshold during singular discrete instance of activation of the yaw motors 202, or based on multiple separate instances of activation of the yaw motors 202 over time.

In the example of a single instance of activation of the yaw motors 202, the analyzers 410 and 412 can evaluate the relative differences of the currents $I_{Y1}$ through $I_{Y4}$ to determine different fault conditions based on the manner in which the relative differences of the currents $I_{Y1}$ through $I_{Y4}$ exceed the threshold. For example, the analyzers 410 and 412 can determine a first fault condition based on the currents $I_{Y1}$ through $I_{Y4}$ or the relative differences of the currents $I_{Y1}$ through $I_{Y4}$ instantaneously exceed the threshold. As another example, the analyzers 410 and 412 can determine a second fault condition based on the currents $I_{Y1}$ through $I_{Y4}$ or the relative differences of the currents $I_{Y1}$ through $I_{Y4}$ exceeding the threshold a predefined quantity of times during the single instance of activation of the yaw motors 202. As yet another example, the analyzers 410 and 412 can determine a third fault condition based on the currents $I_{Y1}$ through $I_{Y4}$ or the relative differences of the currents $I_{Y1}$ through $I_{Y4}$ exceeding the threshold for a predefined duration of time during the single instance of activation of the yaw motors 202 to determine one or more different occurrences of fault conditions.

In the example of FIG. 4, the analyzers 410 and 412 can provide indication of the specific fault condition to the user interface 404. As an example, the user interface 404 can be a part of the enterprise computer system 112 in the wind farm control system 110. As a first example, the fault detection algorithm 402 can be implemented on the processor 220 of the logic controller 216, such that the indication of the fault condition can be provided to the user interface 404 via the communication lines 116. As a second example, the fault detection algorithm 402 can be implemented on a processor of the enterprise computer system 112, such that the current signals $YC_1$ through $YC_4$ can be passed through the processor 220 of the logic controller 216 (e.g., to change a communication format) and provided to the enterprise computer system 112 via the communication lines 116. As yet another example, the specific amplitudes of the currents $I_{Y1}$ through $I_{Y4}$ can be provided to the user interface 404, such as to provide visual verification of the fault condition, such as based on the spurious waveforms of the currents $I_{Y1}$ through $I_{Y4}$, such as provided in the following examples of FIGS. 5-9.

Figure 5:
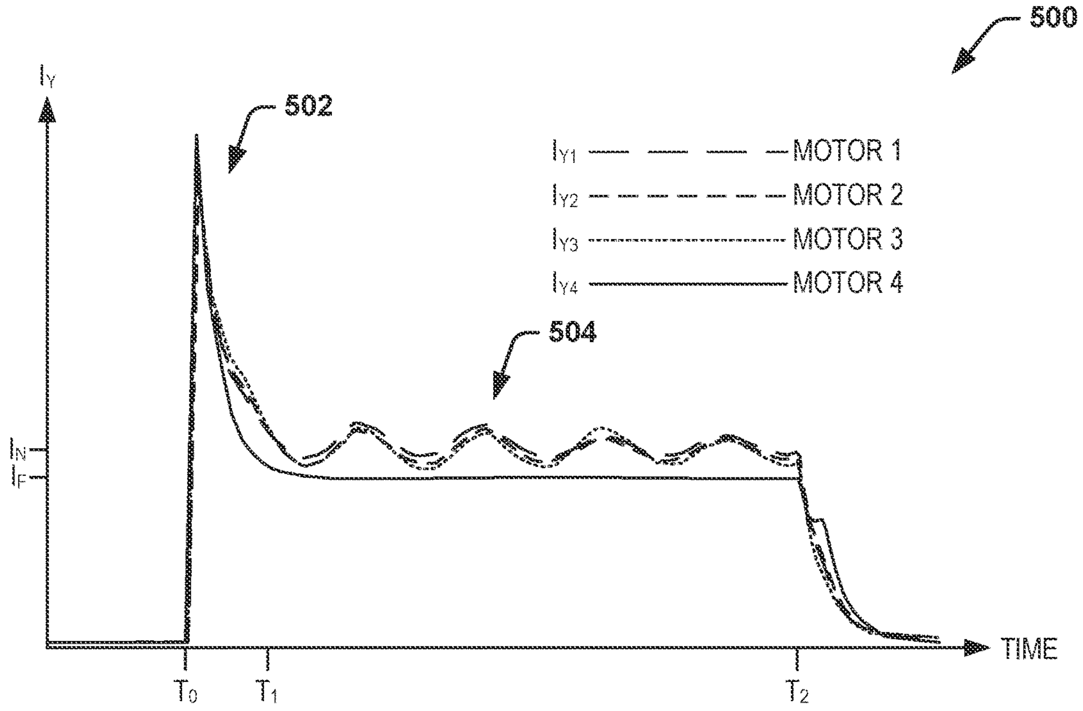
FIG. 5 illustrates an example of a timing diagram.

FIG. 5 illustrates an example of a timing diagram 500. The timing diagram 500 can correspond to an amplitude of the currents $I_{Y1}$ through $I_{Y4}$ over time, provided as a single instance of activation of the yaw motors 302, 304, 306, and 308. The diagram 500 includes different waveforms of the yaw motors 302, 304, 306, and 308, demonstrated as a large dashed line corresponding to the first yaw motor 302 that operates based on the first current $I_{Y1}$, a small dashed line corresponding to the second yaw motor 304 that operates based on the second current $I_{Y2}$, a dotted line corresponding to the third yaw motor 306 that operates based on the third current $I_{Y3}$, and a solid line corresponding to the fourth yaw motor 308 that operates based on the fourth current $I_{Y4}$.

In the diagram 500, at a time $T_0$, the yaw motors 302, 304, 306, and 308 are activated concurrently. Each of the yaw motors 302, 304, 306, and 308 exhibit a significant increase of the respective currents $I_{Y1}$ through $I_{Y4}$ during an initial inrush region of the waveforms, demonstrated generally at 502. Subsequent to the inrush region 502, the currents $I_{Y1}$ through $I_{Y4}$ decrease in amplitude to a normal operating region, demonstrated generally at 504 and beginning at a time $T_1$. The normal operating region 504 thus nominally corresponds to a predictable pattern of current oscillation waveforms having little variation in amplitude with respect to each other and to a center amplitude $I_N$ (e.g., a DC offset of the currents $I_{Y1}$ through $I_{Y4}$). At a time $T_2$, the yaw motors 302, 304, 306, and 308 are deactivated, at which time the currents $I_{Y1}$ through $I_{Y4}$ begin to decrease to zero, thereby ending the yaw motion of the nacelle of the wind turbine.

In the example of FIG. 5, the current $I_{Y4}$ of the fourth motor 308 is detected as having a static amplitude $I_F$ in the normal operating region 504 between the times $T_1$ and $T_2$, and thus varies relative to the currents $I_{Y1}$, $I_{Y2}$, and $I_{Y3}$. As an example, the analyzers 410 and 412 can evaluate the differences of the currents $I_{Y1}$ through $I_{Y4}$ relative to a dynamic threshold that is greater than and less than the predictable pattern of current oscillation waveforms by a predetermined amplitude, or can evaluate the differences of the currents $I_{Y1}$ through $I_{Y4}$ relative to a static threshold relative to any one other current $I_{Y1}$ through $I_{Y4}$ (e.g., once or multiple times during the normal operating region 504). Based on the manner in which the programmed thresholds 408 are set, the analyzers 410 and 412 can detect that the fourth current $I_{Y4}$ has exceeded the threshold, thereby indicating a fault condition. Based on detecting that the fourth current $I_{Y4}$ has a static amplitude $I_F$ relative to the other currents $I_{Y1}$, $I_{Y2}$, and $I_{Y3}$, the analyzers 410 and 412 can determine the specific fault condition, such as associated with a specific one of the yaw mechanical drive components 204. For example, that the fourth current $I_{Y4}$ has a static amplitude $I_F$ relative to the other currents $I_{Y1}$, $I_{Y2}$, and $I_{Y3}$ can be indicative of a failed (or failing) yaw drive 210. Therefore, the indication of the failed (or failing) yaw drive 210 as the fault condition can be provided to the user interface 404 to facilitate a course of action for maintenance or replacement of the respective yaw drive 210.

Figure 6:
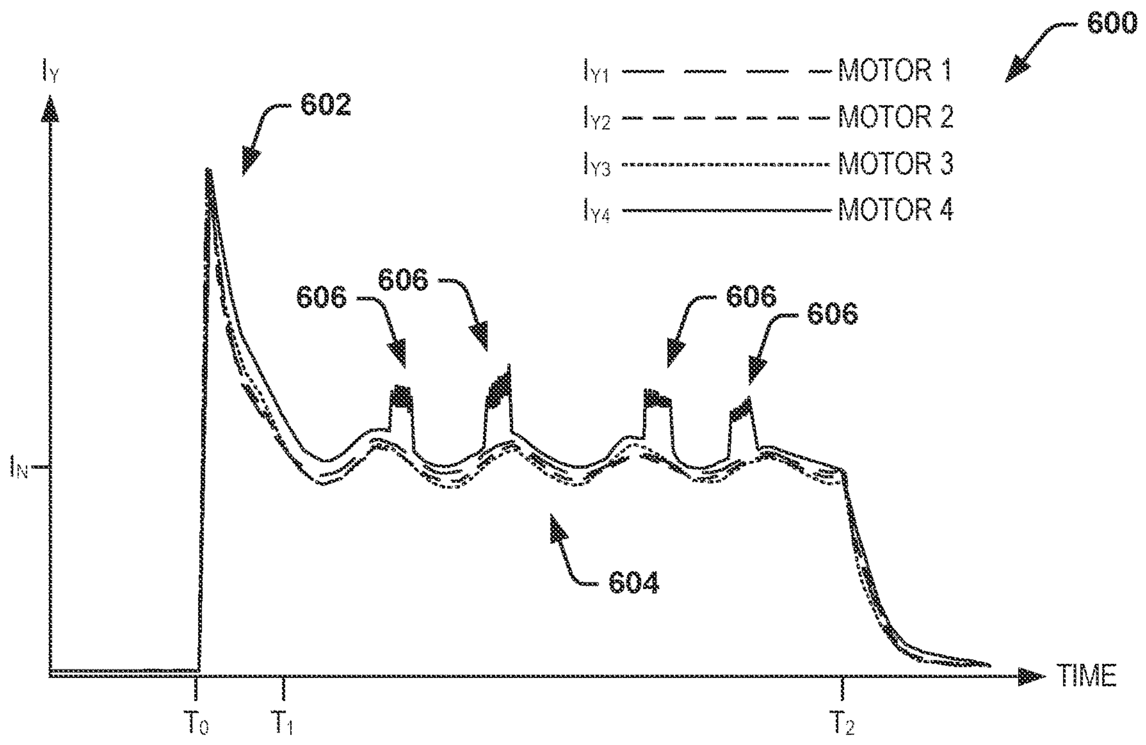
FIG. 6 illustrates another example of a timing diagram.

FIG. 6 illustrates another example of a timing diagram 600. Similar to the timing diagram 500, the timing diagram 600 can correspond to an amplitude of the currents $I_{Y1}$ through $I_{Y4}$ in a single instance of activation of the yaw motors 302, 304, 306, and 308. In the diagram 600, at a time $T_0$, the yaw motors 302, 304, 306, and 308 are activated concurrently. Each of the yaw motors 302, 304, 306, and 308 exhibit a significant increase of the respective currents $I_{Y1}$ through $I_{Y4}$ during an initial inrush region of the waveforms, demonstrated generally at 602. Subsequent to the inrush region 602, the currents $I_{Y1}$ through $I_{Y4}$ decrease in amplitude to a normal operating region, demonstrated generally at 604 and beginning at a time $T_1$. The normal operating region 604 thus nominally corresponds to a predictable pattern of current oscillation waveforms having little variation in amplitude with respect to each other and to a center amplitude $I_N$ (e.g., a DC offset of the currents $I_{Y1}$ through $I_{Y4}$). At a time $T_2$, the yaw motors 302, 304, 306, and 308 are deactivated, at which time the currents $I_{Y1}$ through $I_{Y4}$ begin to decrease to zero, thereby ending the yaw motion of the nacelle of the wind turbine.

In the example of FIG. 6, the current $I_{Y4}$ of the fourth motor 308 is detected as having a sharp increases in amplitude at various times during the normal operating region 604 of the single activation instance of the yaw motors 302, 304, 306, and 308, demonstrated generally at 606. The sharp increases 606 can correspond to short time duration increases of the current $I_{Y4}$ relative to the currents $I_{Y1}$, $I_{Y2}$, and $I_{Y3}$. As an example, the analyzers 410 and 412 can evaluate the differences of the currents $I_{Y1}$ through $I_{Y4}$ relative to a dynamic threshold that is greater than and less than the predictable pattern of current oscillation waveforms by a predetermined amplitude, or can evaluate the differences of the currents $I_{Y1}$ through $I_{Y4}$ relative to a static threshold relative to any one other current $I_{Y1}$ through $I_{Y4}$, such as based on multiple instances.

Based on the manner in which the programmed thresholds 408 are set, the analyzers 410 and 412 can detect that the fourth current $I_{Y4}$ has exceeded the threshold multiple times in response to the sharp increases 606, thereby indicating a fault condition. Based on detecting that the fourth current $I_{Y4}$ exhibits the sharp increases 606 relative to the other currents $I_{Y1}$, $I_{Y2}$, and $I_{Y3}$, the analyzers 410 and 412 can determine the specific fault condition, such as associated with a specific one of the yaw mechanical drive components 204. For example, that the fourth current $I_{Y4}$ has the sharp increases 606 relative to the other currents $I_{Y1}$, $I_{Y2}$, and $I_{Y3}$ can be indicative of failed (or failing) motor bearings 206. Therefore, the indication of the failed (or failing) motor bearings 206 as the fault condition can be provided to the user interface 404 to facilitate a course of action for maintenance or replacement of the respective motor bearings 206.

Figure 7:
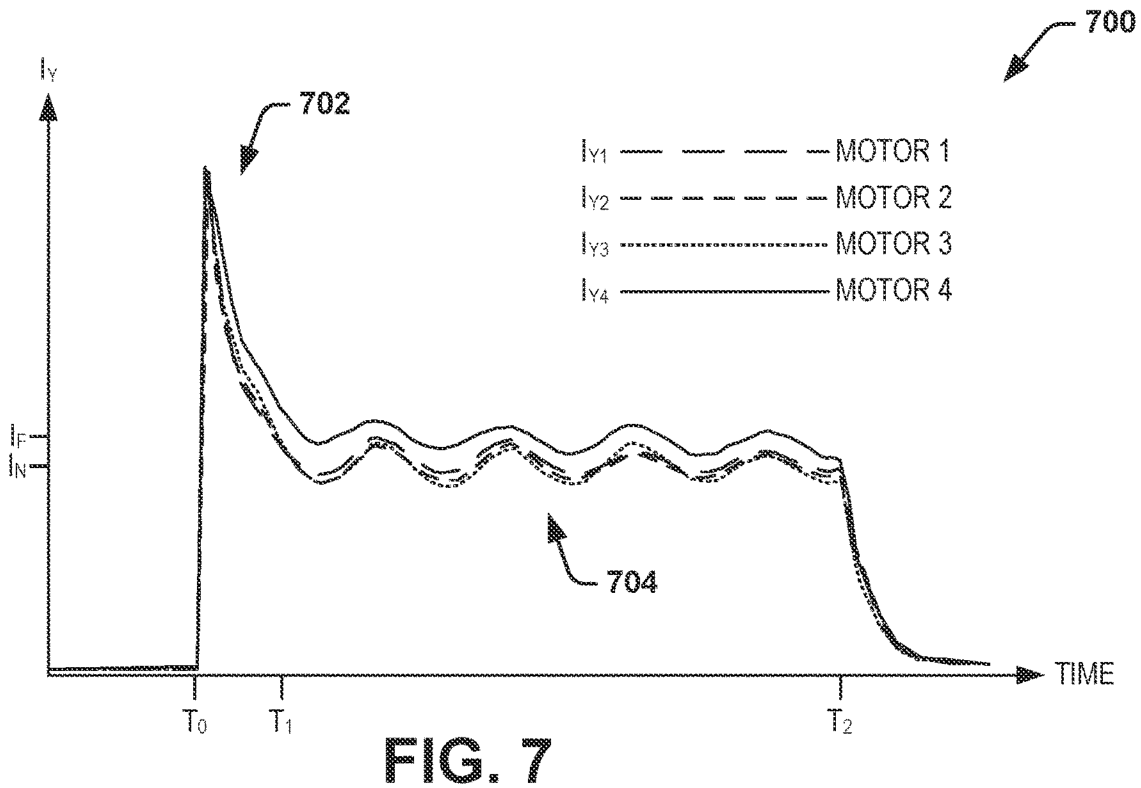
FIG. 7 illustrates another example of a timing diagram.

FIG. 7 illustrates another example of a timing diagram 700. Similar to the timing diagram 500, the timing diagram 700 can correspond to an amplitude of the currents $I_{Y1}$ through $I_{Y4}$ in a single instance of activation of the yaw motors 302, 304, 306, and 308. In the diagram 700, at a time $T_0$, the yaw motors 302, 304, 306, and 308 are activated concurrently. Each of the yaw motors 302, 304, 306, and 308 exhibit a significant increase of the respective currents $I_{Y1}$ through $I_{Y4}$ during an initial inrush region of the waveforms, demonstrated generally at 702. Subsequent to the inrush region 702, the currents $I_{Y1}$ through $I_{Y4}$ decrease in amplitude to a normal operating region, demonstrated generally at 704 and beginning at a time $T_1$. The normal operating region 704 thus nominally corresponds to a predictable pattern of current oscillation waveforms having little variation in amplitude with respect to each other and to a center amplitude Ix (e.g., a DC offset of the currents $I_{Y1}$ through $I_{Y4}$). At a time $T_2$, the yaw motors 302, 304, 306, and 308 are deactivated, at which time the currents $I_{Y1}$ through $I_{Y4}$ begin to decrease to zero, thereby ending the yaw motion of the nacelle of the wind turbine.

In the example of FIG. 7, the current $I_{Y4}$ of the fourth motor 308 is detected as having an amplitude that, while still sinusoidal, is greater than the amplitudes of the currents $I_{Y1}$, $I_{Y2}$, and $I_{Y3}$ of the respective yaw motors 302, 304, and 306. The diagram 700 demonstrates that the current $I_{Y4}$ has a center amplitude of $I_F$ that is greater than the center amplitude of $I_N$. As an example, the analyzers 410 and 412 can evaluate the differences of the currents $I_{Y1}$ through $I_{Y4}$ relative to a dynamic threshold that is greater than and less than the predictable pattern of current oscillation waveforms by a predetermined amplitude, such as over a duration of time in the normal operating region 704.

Based on the manner in which the programmed thresholds 408 are set, the analyzers 410 and 412 can detect that the fourth current $I_{Y4}$ has exceeded the threshold based on the increased center amplitude $I_F$ of the fourth current $I_{Y4}$ being greater than the center amplitude $I_N$ of the other currents $I_{Y1}$, $I_{Y2}$, and $I_{Y3}$, thereby indicating a fault condition. In response to detecting that the fourth current $I_{Y4}$ has exceeded the threshold based on the increased center amplitude $I_F$ of the fourth current $I_{Y4}$ being greater than the center amplitude Ix of the other currents $I_{Y1}$, $I_{Y2}$, and $I_{Y3}$, the analyzers 410 and 412 can determine the specific fault condition, such as associated with a specific one of the yaw mechanical drive components 204. For example, that the fourth current $I_{Y4}$ has a center amplitude $I_F$ greater than the center amplitude $I_N$ of the other currents $I_{Y1}$, $I_{Y2}$, and $I_{Y3}$ can be indicative of a fault associated with the brake 212. For example, the fault of the brake 212 can correspond to a variety of failures of the brake 212, such as based on a failure of a brake 212 to disengage from the yaw drive 210 of the fourth yaw motor 308. As another example, the predictable pattern of current oscillation waveforms can indicate a predictive fault of the brake 212, such as to require an adjustment to brake gapping. Therefore, the indication of the failed (or failing) brake 212 as the fault condition can be provided to the user interface 404 to facilitate a course of action for maintenance or replacement of the respective brake 212.

Figure 8:
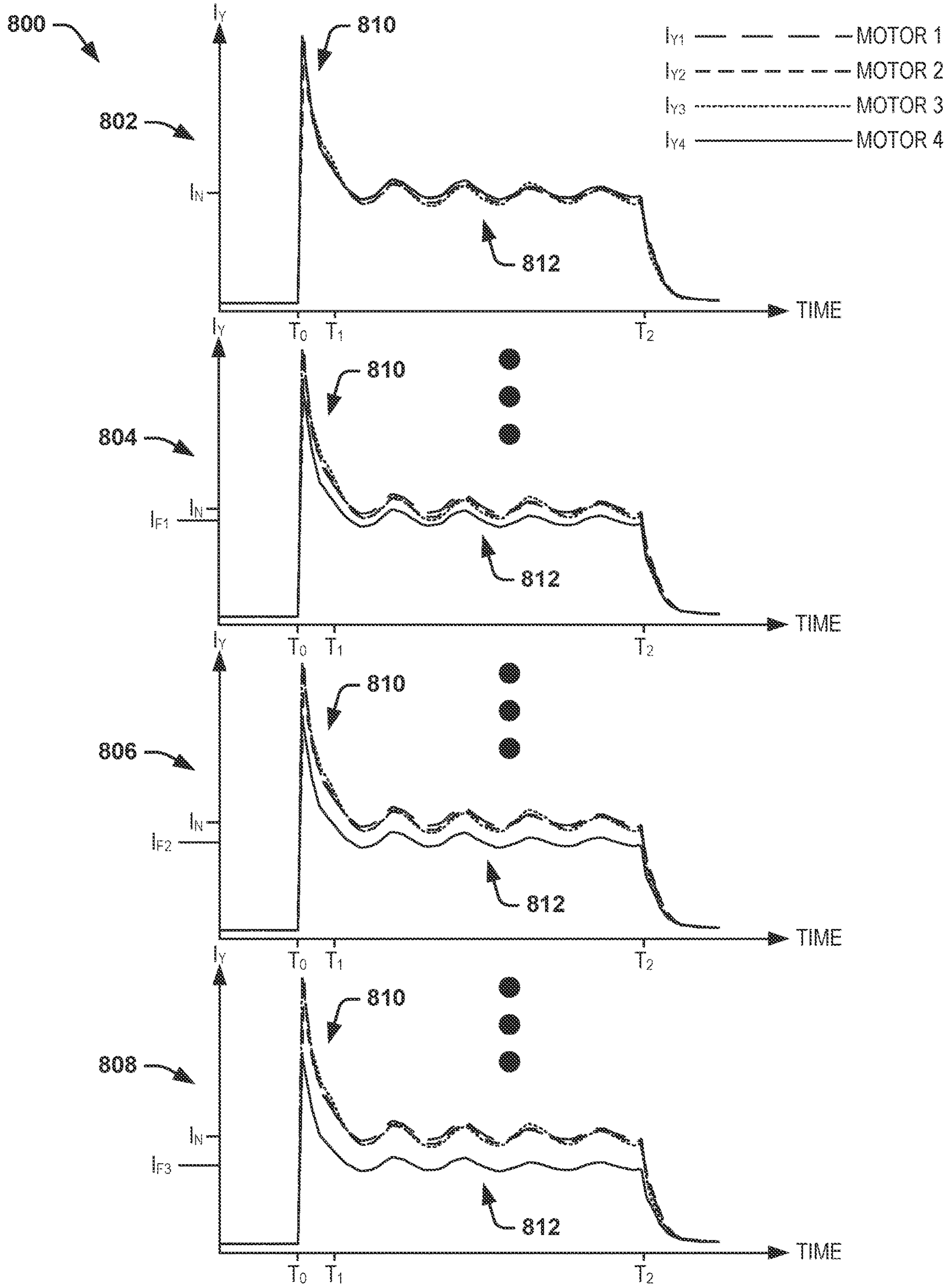
FIG. 8 illustrates an example diagram of multiple timing diagrams.

As described above, the analyzers 410 and 412 can determine if an amplitude of one of the currents $I_{Y1}$ through $I_{Y4}$ is different than the other currents $I_{Y1}$ through $I_{Y4}$ by a threshold during multiple separate instances of activation of the yaw motors 202 over time. FIG. 8 illustrates an example diagram 800 of multiple timing diagrams. The multiple timing diagrams include a first timing diagram 802, a second timing diagram 804, a third timing diagram 806, and a fourth timing diagram 808. Each of the timing diagrams 802, 804, 806, and 808 can correspond to an amplitude of the currents $I_{Y1}$ through $I_{Y4}$ in separate respective instances of activation of the yaw motors 302, 304, 306, and 308 over time, with each such separate instance not necessarily being consecutive. In each of the diagrams 802, 804, 806, and 808, at a time $T_0$, the yaw motors 302, 304, 306, and 308 are activated concurrently. Each of the yaw motors 302, 304, 306, and 308 exhibit a significant increase of the respective currents $I_{Y1}$ through $I_{Y4}$ during an initial inrush region of the waveforms, demonstrated generally at 810. Subsequent to the inrush region 810, the currents $I_{Y1}$ through $I_{Y4}$ decrease in amplitude to a normal operating region, demonstrated generally at 812 and beginning at a time $T_1$. The normal operating region 812 thus nominally corresponds to a predictable pattern of current oscillation waveforms having little variation in amplitude with respect to each other and to a center amplitude $I_N$ (e.g., a DC offset of the currents $I_{Y1}$ through $I_{Y4}$). At a time $T_2$, the yaw motors 302, 304, 306, and 308 are deactivated, at which time the currents $I_{Y1}$ through $I_{Y4}$ begin to decrease to zero, thereby ending the yaw motion of the nacelle of the wind turbine.

In the example of FIG. 8, the average amplitude of the current $I_{Y4}$ of the fourth motor 308 is detected as steadily decreasing over time. In the first diagram 802, the current $I_{Y4}$ of the fourth yaw motor 308 has an amplitude that is approximately equal to the amplitudes of the currents $I_{Y1}$, $I_{Y2}$, and $I_{Y3}$ of the respective yaw motors 302, 304, and 306, at the center amplitude $I_N$. In the second diagram 804, corresponding to an activation instance of the yaw motors 302, 304, 306, and 308 at a time subsequent to the activation instance of the diagram 802, the current $I_{Y4}$ has an amplitude $I_{F1}$ that is slightly less than the center amplitude $I_N$. In the third diagram 806, corresponding to an activation instance of the yaw motors 302, 304, 306, and 308 at a time subsequent to the activation instance of the diagram 804, the current $I_{Y4}$ has an amplitude $I_{F2}$ that is slightly less than the amplitude $I_{F1}$, thus demonstrating a further decrease of the amplitude of the current $I_{Y4}$. In the fourth diagram 808, corresponding to an activation instance of the yaw motors 302, 304, 306, and 308 at a time subsequent to the activation instance of the diagram 806, the current $I_{Y4}$ has an amplitude $I_{F3}$ that is slightly less than the amplitude $I_{F2}$, thus demonstrating yet a further decrease of the amplitude of the current $I_{Y4}$.

As an example, the analyzers 410 and 412 can evaluate the differences of the currents $I_{Y1}$ through $I_{Y4}$ relative to a threshold over multiple instances of activation of the yaw motors 302, 304, 306, and 308. As an example, the threshold can correspond to a static threshold of the currents $I_{Y1}$ through $I_{Y4}$ relative to each other over multiple activation instances. Additionally or alternatively, the threshold can correspond to changes of the amplitudes of each of the currents $I_{Y1}$ through $I_{Y4}$ over the multiple activation instances, such as based on a predefined count of activation instances in which a given one of the currents $I_{Y1}$ through $I_{Y4}$ decreases at each activation instance. As yet another example, the threshold can correspond to a threshold of the average amplitudes of the currents $I_{Y1}$ through $I_{Y4}$ relative to each other over the predefined multiple activation instances.

Based on the manner in which the programmed thresholds 408 are set, the analyzers 410 and 412 can detect that the fourth current $I_{Y4}$ has exceeded the threshold based on the fourth current $I_{Y4}$ decreasing steadily over multiple activation instances, thereby indicating a fault condition. In response to detecting that the fourth current $I_{Y4}$ decreases steadily over multiple activation instances, the analyzers 410 and 412 can determine the specific fault condition, such as associated with a specific one of the yaw mechanical drive components 204. For example, that the fourth current $I_{Y4}$ decreases steadily over multiple activation instances can be indicative of worn pucks 208, and therefore indicating that the pucks 208 have failed or are failing. Therefore, the indication of the failed (or failing) pucks 208 as the fault condition can be provided to the user interface 404 to facilitate a course of action for maintenance or replacement of the respective pucks 208.

As another example, the analyzers 410 and 412 can determine if an amplitude of one of the currents $I_{Y1}$ through $I_{Y4}$ of a respective one of the yaw motors 302, 304, 306, and 308 is different than the current of the same one of the yaw motors 302, 304, 306, and 308 by a threshold during different times of the same instance of activation of the yaw motors 302, 304, 306, and 308. As yet another example, the analyzers 410 and 412 can determine if an amplitude of one of the currents $I_{Y1}$ through $I_{Y4}$ of a respective one of the yaw motors 302, 304, 306, and 308 is different than the current of the same one of the yaw motors 302, 304, 306, and 308 by a threshold during different activation instances of the yaw motors 302, 304, 306, and 308 over time.

Figure 9:
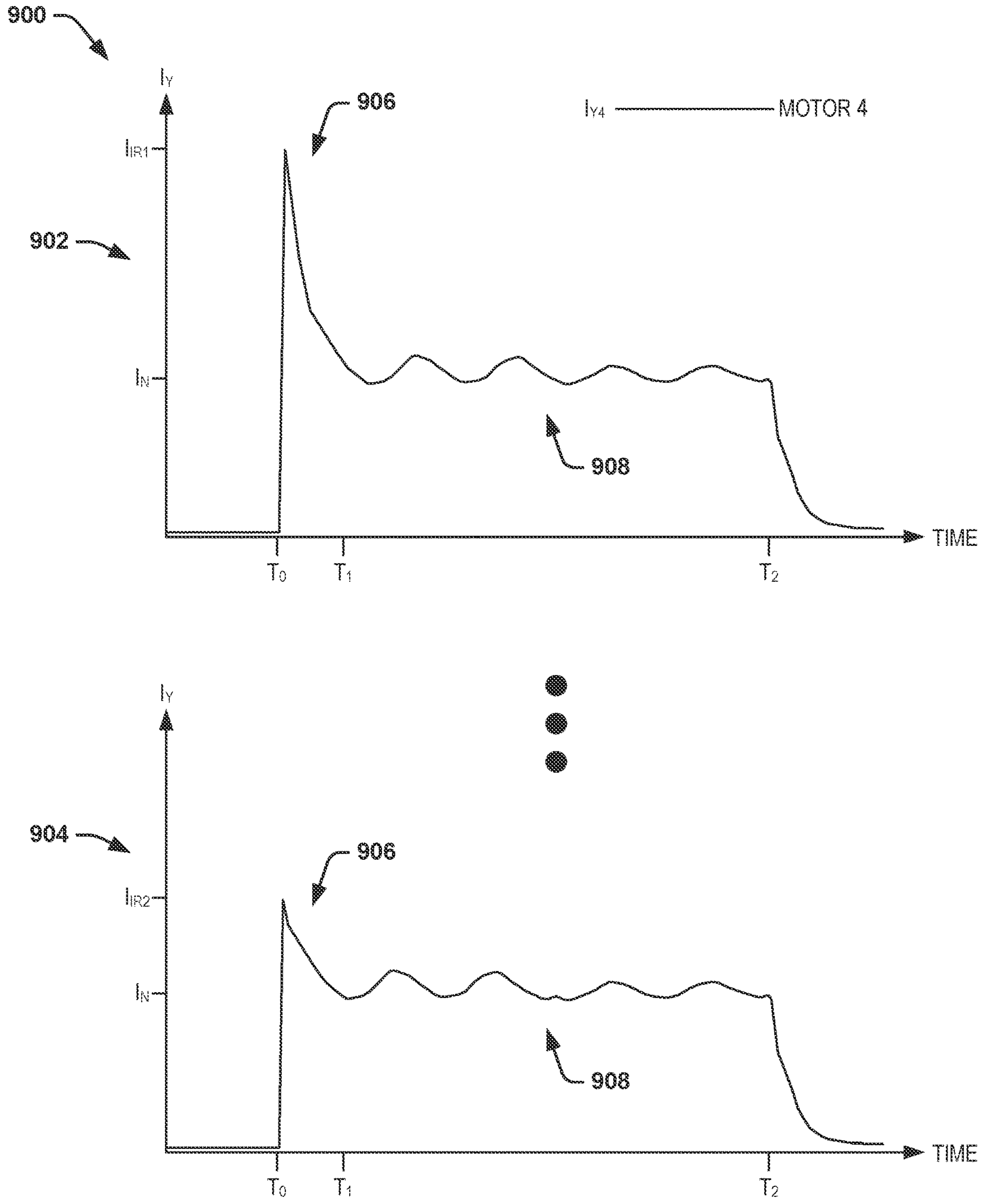
FIG. 9 illustrates another example diagram of multiple timing diagrams.

FIG. 9 illustrates an example diagram 900 of multiple timing diagrams. The multiple timing diagrams include a first timing diagram 902 and a second timing diagram 904 corresponding to an amplitude of the current $I_{Y4}$ of the fourth yaw motor 308 in separate respective instances of activation of the yaw motors 302, 304, 306, and 308 over time, with the second timing diagram 904 being not necessarily consecutive relative to the first timing diagram 902. In each of the diagrams 902 and 904, at a time $T_0$, the yaw motor 308 is activated and exhibits an initial inrush current, demonstrated generally at 906. Subsequent to the inrush region 906, the current $I_{Y4}$ decreases in amplitude to a normal operating region, demonstrated generally at 908 and beginning at a time $T_1$. The normal operating region 908 thus nominally corresponds to a stable AC waveform having little variation in amplitude with respect to a center amplitude $I_N$. At a time $T_2$, the yaw motor 308 is deactivated, at which time the current $I_{Y4}$ begins to decrease to zero, thereby ending the yaw motion of the nacelle of the wind turbine. While the example of FIG. 9 demonstrates only the current $I_{Y4}$ of the fourth yaw motor 308, the other currents $I_{Y1}$, $I_{Y2}$, and $I_{Y3}$ of the respective other motors 302, 304, and 306 are assumed to be operating normally.

In the example of FIG. 9, the amplitude of the current $I_{Y4}$ of the fourth motor 308 is detected as steadily decreasing over time in the inrush region 906. Stated another way, the inrush current of the fourth motor 308 is demonstrated as steadily decreasing over multiple activation instances. In the first diagram 902, the current $I_{Y4}$ of the fourth yaw motor 308 has a peak inrush amplitude of $I_{IR1}$. In the second diagram 904, corresponding to an activation instance of the yaw motors 302, 304, 306, and 308 at a time subsequent to the activation instance of the diagram 902, the current $I_{Y4}$ of the fourth yaw motor 308 has a peak inrush amplitude of $I_{IR2}$, which is less than the peak inrush amplitude $I_{IR1}$.

As an example, the analyzers 410 and 412 can evaluate the amplitude of the inrush current amplitudes of the currents $I_{Y1}$ through $I_{Y4}$ relative to a threshold over a single instance or multiple instances of activation of the yaw motors 302, 304, 306, and 308. As an example, the threshold can correspond to a static threshold of the inrush peaks of the currents $I_{Y1}$ through $I_{Y4}$ relative to each other, or of changes of the inrush peak amplitude of the currents $I_{Y1}$ through $I_{Y4}$ relative to the same currents $I_{Y1}$ through $I_{Y4}$ over multiple activation instances. Additionally or alternatively, the threshold can correspond to a difference between the peak inrush amplitude of a given one of the currents $I_{Y1}$ through $I_{Y4}$ relative to the center amplitude $I_N$ in a given one activation instance of the yaw motors 302, 304, 306, and 308.

Based on the manner in which the programmed thresholds 408 are set, the analyzers 410 and 412 can detect that the fourth current $I_{Y4}$ has exceeded (e.g., decreased below) the threshold based on the peak inrush amplitude of the fourth current $I_{Y4}$ decreasing steadily over multiple activation instances, thereby indicating a fault condition. In response to detecting that the peak inrush amplitude of the fourth current $I_{Y4}$ has decreased steadily over multiple activation instances, the analyzers 410 and 412 can determine the specific fault condition, such as associated with a specific one of the yaw mechanical drive components 204. For example, that the peak inrush amplitude of the fourth current $I_{Y4}$ has decreased steadily over multiple activation instances can be indicative that the fourth yaw motor 308 is failing. Therefore, the indication of the failing yaw motor 308 as the fault condition can be provided to the user interface 404 to facilitate a course of action for maintenance or replacement of the respective yaw motor 308.

The examples of FIGS. 5-9 therefore demonstrate some examples of how the fault detection algorithm 402 can determine not only the occurrence of a fault condition, but a fault condition associated with a specific one of the yaw mechanical drive components 204 to facilitate a significantly more efficient maintenance or replacement plan for the respective yaw control system 200. The examples of FIGS. 5-9 are not exhaustive, such that other types of thresholds can be programmed and/or other types of statistical analyses (e.g., evaluating frequency of the three-phase yaw motors 302, 304, 306, and 308) can be implemented for determining specific fault conditions. Examples can include the capability to identify yaw anomalies with comparative total current draw for yawing left or right rotation, and/or the capability to identify a missing yaw motor 202. The fault detection algorithm can also be configured to implement comparative analyses of the yaw motor currents between wind turbines 114 to identify anomalies between different wind turbines. The fault detection algorithm can further be configured to implement analysis of the yaw motor currents to provide quality checks after performing maintenance, repairs, or replacements of the yaw mechanical drive components 204, or to provide diagnostic analysis of the yaw motors 202, such as the ability to replace motor temperature sensors with a calculated RMS based on specifications/characteristics of the windings of the yaw motors 212.

Accordingly, by comparing the amplitudes of the currents $I_{Y1}$ through $I_{Y4}$ with each other and with the programmed thresholds 408, the fault detection algorithm 402 can identify fault conditions associated with specific yaw mechanical drive components 204.

Figure 10:
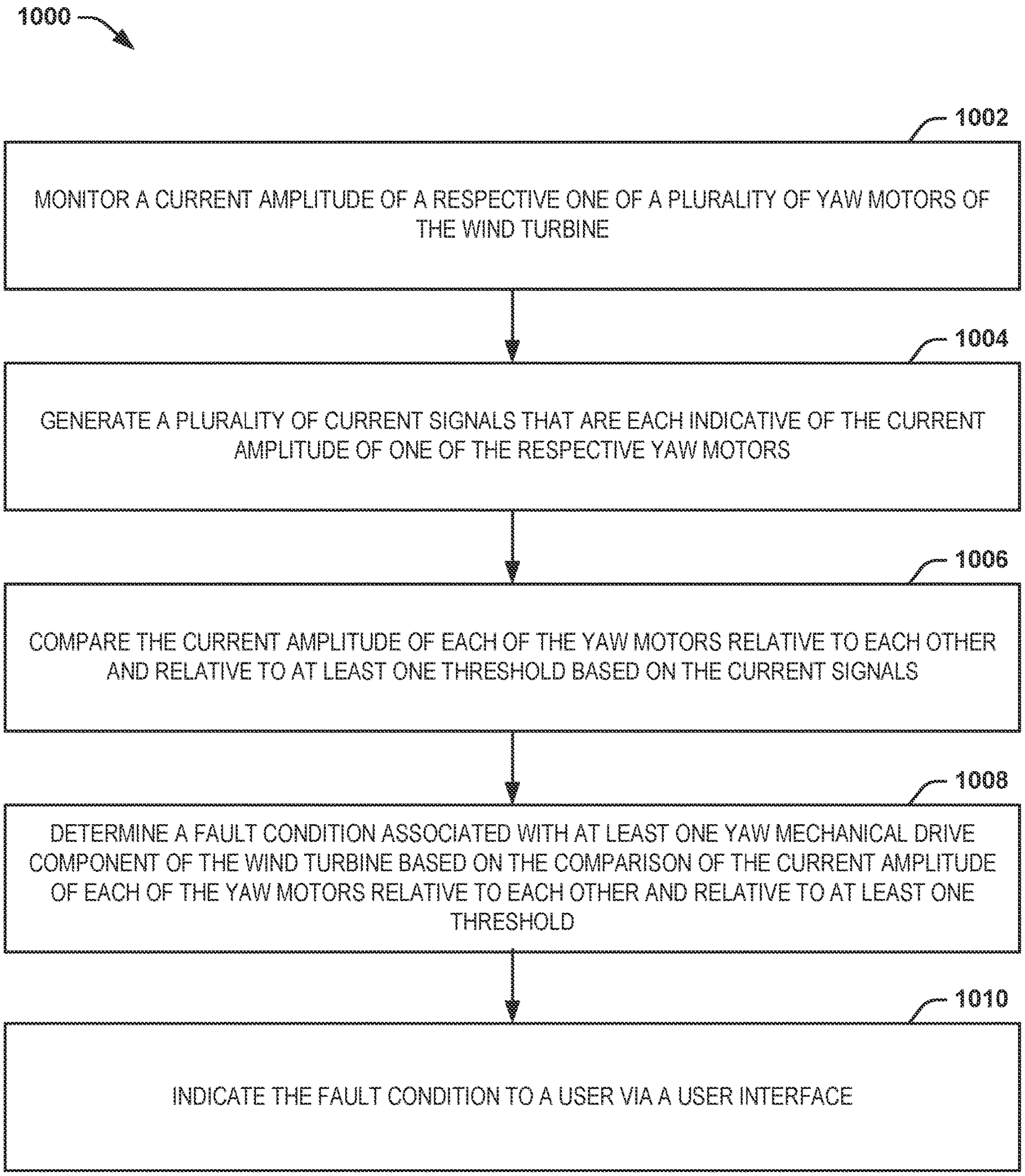
FIG. 10 illustrates an example of a method for determining a fault condition associated with a wind turbine.

In view of the foregoing structural and functional features described above, a methodology in accordance with various aspects of the present invention will be better appreciated with reference to FIG. 10. While, for purposes of simplicity of explanation, the methodology of FIG. 10 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 10 illustrates an example of a method 1000 for determining a fault condition associated with a wind turbine (e.g., one of the wind turbines 114). The method 1000 can be implemented on a non-transitory computer readable medium, such as part of a fault detection algorithm (e.g., the fault detection algorithm 222) on a processor (e.g., the processor 220 or a processor of the enterprise computer system 114). At 1002, a current amplitude of a respective one of a plurality of yaw motors (e.g., the yaw motors 202) of the wind turbine is monitored. At 1004, a plurality of current signals (e.g., the current signals $YC_1$ through $YC_N$) that are each indicative of the current amplitude of one of the respective yaw motors are generated. At 1006, the current amplitude of each of the yaw motors is compared relative to each other and relative to at least one threshold (e.g., the programmed thresholds 408) based on the current signals. At 1008, a fault condition associated with at least one yaw mechanical drive component (e.g., the yaw mechanical drive components 204) of the wind turbine is determined based on the comparison of the current amplitude of each of the yaw motors relative to each other and relative to at least one threshold. At 1010, the fault condition is indicated to a user via a user interface (e.g., the user interface 404).

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A yaw control fault detection system comprising:

a plurality of current monitors that are each configured to monitor a current amplitude of a respective one of a plurality of yaw motors of a wind turbine and to generate a current signal that is indicative of the respective current amplitude; and a processor configured to perform operations comprising:

receiving the current signal from each of the current monitors, generating one or more comparison values by comparing the current amplitude of each of the yaw motors relative to each other, and determining a fault condition associated with at least one yaw mechanical drive component of the wind turbine based on comparing the generated one or more comparison values to at least one threshold.

2. The system of claim 1, wherein the operations comprise:

comparing the current amplitude of each of the yaw motors relative to each other over a duration of time of activation of the yaw motors and relative to at least one time-dependent threshold to determine the fault condition associated with the at least one yaw mechanical drive component of the wind turbine.

3. The system of claim 2, wherein the operations comprise:

comparing the current amplitude of each of the yaw motors relative to the respective yaw motor over the duration of time of activation of the respective yaw motor relative to the at least one time-dependent threshold to determine the fault condition associated with the at least one yaw mechanical drive component.

4. The system of claim 2, wherein the at least one time-dependent threshold comprises an activation threshold corresponding to a change of the current amplitude of each of the yaw motors over a plurality of separate instances of activation of the yaw motors.

5. The system of claim 1, wherein each of the yaw motors are arranged as three-phase AC motors, wherein the each of the current monitors is configured to monitor the current amplitude of one phase of the three-phase AC motors, wherein the one phase is a same phase for each of the yaw motors.

6. The system of claim 1, wherein determining the fault condition comprises:

predicting a fault will occur at a future point in time based on comparing the current amplitude of each of the yaw motors relative to each other and relative to the at least one threshold.

7. The system of claim 1, wherein the at least one yaw mechanical drive component includes a plurality of yaw mechanical components, wherein the operations comprise:

comparing the current amplitude of each of the yaw motors relative to each other and relative to the at least one threshold to identify a specific one of the plurality of yaw mechanical components that exhibits the fault condition based on comparing the current amplitude of each of the yaw motors relative to each other and relative to the at least one threshold.

8. A yaw motor control system associated with the wind turbine, the yaw motor control system comprising the yaw control fault detection system of claim 1, the yaw motor control system further comprising:

the plurality of yaw motors;

the at least one yaw mechanical drive component; and a logic controller configured to control operation of the wind turbine.

9. The yaw motor control system of claim 8, wherein the logic controller comprises the processor.

10. The yaw motor control system of claim 8, wherein the logic controller is configured to transmit the current signal from each of the current monitors to an enterprise computer system via at least one communication line associated with a wind farm that comprises the wind turbine, the enterprise computer system comprising the processor, wherein the processor is configured to indicate the fault condition to at least one user via a user interface associated with the enterprise computer system.

11. A method for determining a fault condition associated with a wind turbine, the method comprising:

receiving a current signal for each of a a plurality of yaw motors of a wind turbine;

generating one or more comparison values by comparing a current amplitude of each of the yaw motors relative to each other;

determining a fault condition associated with at least one yaw mechanical drive component of the wind turbine based on comparing the generated one or more comparison values to at least one threshold; and indicating the fault condition to a user via a user interface.

12. The method of claim 11, wherein comparing the current amplitude comprises:

comparing the current amplitude of each of the yaw motors relative to each other over a duration of time of activation of the yaw motors and relative to at least one time-dependent threshold, wherein determining the fault condition comprises:

determining the fault condition associated with the at least one yaw mechanical drive component of the wind turbine based on comparing the generated one or more comparison values to the at least one time-dependent threshold.

13. The method of claim 12, wherein comparing the current amplitude comprises:

comparing the current amplitude of each of the yaw motors relative to a respective yaw motor over the duration of time of activation of the respective yaw motor relative to the at least one time-dependent threshold, wherein determining the fault condition comprises:

determining the fault condition associated with the at least one yaw mechanical drive component of the wind turbine based on comparing the generated one or more comparison values to the respective yaw motor over the duration of time of activation of the respective yaw motor relative to the at least one time-dependent threshold.

14. The method of claim 11, wherein determining the fault condition comprises:

predicting a fault will occur at a future point in time based on comparing the current amplitude of each of the yaw motors relative to each other and relative to the at least one threshold.

15. The method of claim 11, wherein the at least one yaw mechanical drive component includes a plurality of yaw mechanical components, wherein determining the fault condition comprises:

identifying a specific one of the plurality of yaw mechanical components that exhibits the fault condition based on comparing the generated one or more comparison values to the at least one threshold.

16. A yaw motor control system associated with a wind turbine, the yaw motor control system comprising:

a plurality of yaw motors;

a plurality of yaw mechanical drive components;

a logic controller configured to control operation of the wind turbine; and a yaw control fault detection system, the yaw control fault detection system comprising:

a plurality of current monitors that are each configured to monitor a current amplitude of a respective one of the yaw motors and to generate a current signal that is indicative of the respective current amplitude; and a processor configured to perform operations comprising:

receiving the current signal from each of the current monitors;

generating one or more comparison values by comparing the current amplitude of each of the yaw motors relative to each other; and determining a fault condition associated with at least one of the yaw mechanical drive components of the wind turbine based on comparing the generated one or more comparison values to at least one threshold.

17. The system of claim 16, wherein the operations comprise:

comparing the current amplitude of each of the yaw motors relative to each other over a duration of time of activation of the yaw motors and relative to at least one time-dependent threshold to determine the fault condition associated with at least one yaw mechanical drive component of the wind turbine.

18. The system of claim 17, wherein the operations comprise:

comparing the current amplitude of each of the yaw motors relative to a respective yaw motor over the duration of time of activation of the respective yaw motor relative to the at least one time-dependent threshold to determine the fault condition associated with the at least one yaw mechanical drive component.

19. The system of claim 16, wherein the operations comprise:

comparing the current amplitude of each of the yaw motors relative to each other and relative to the at least one threshold to identify a specific one of the yaw mechanical drive components that exhibits the fault condition based on the comparison of the current amplitude of each of the yaw motors relative to each other and relative to the at least one threshold.

20. The yaw motor control system of claim 16, wherein the logic controller is configured to transmit the current signal from each of the current monitors to an enterprise computer system via at least one communication line associated with a wind farm that comprises the wind turbine, the enterprise computer system comprising the processor, wherein the operations comprise:

indicating the fault condition to at least one user via a user interface associated with the enterprise computer system.

* * * * *